(12) United States Patent
Bentley et al.

(10) Patent No.: US 10,754,495 B1
(45) Date of Patent: Aug. 25, 2020

(54) 3-D SCREEN MENUS (71) Applicant: Bentley Systems, Incorporated, Exton, PA (US)

(72) Inventors: Barry J. Bentley, Elverson, PA (US); Gino Cortesi, Honey Brook, PA (US); R. Brien Bastings, Glenmoore, PA (US)

(73) Assignee: Bentley Systems, Incorporated, Exton, PA (US)

( * ) Notice: Subject to any disclaimer, the term of this patent is extended or adjusted under 35 U.S.C. 154(b) by 314 days.

(21) Appl. No.: 15/091,266

(22) Filed: Apr. 5, 2016

(51) Int. Cl.
*G06F 3/048* (2013.01)
*G06F 3/0481* (2013.01)
*G06F 3/0484* (2013.01)
*G06F 30/00* (2020.01)

(52) U.S. Cl.
CPC ...... *G06F 3/04815* (2013.01); *G06F 3/04817* (2013.01); *G06F 3/04845* (2013.01); *G06F 3/04847* (2013.01); *G06F 30/00* (2020.01); *G06F 2203/04806* (2013.01)

(58) Field of Classification Search
CPC .......... G06F 17/50; G06F 3/048; G06T 15/00
See application file for complete search history.

(56) References Cited

U.S. PATENT DOCUMENTS

| | | | |
|---|---|---|---|
| 6,199,125 B1 | 3/2001 | Cortesi | |
| 6,853,390 B1 | 2/2005 | Wandersleben et al. | |
| 7,418,666 B2 | 8/2008 | Cortesi et al. | |
| 7,571,392 B2 | 8/2009 | Cortesi | |
| 7,599,820 B2 | 10/2009 | Inzinga et al. | |
| 9,069,455 B2 * | 6/2015 | Sripada | G06F 3/0488 |
| 10,353,916 B2 * | 7/2019 | Bentley | G06T 17/00 |
| 10,503,603 B2 * | 12/2019 | Wilson | G06F 16/258 |
| 2005/0097574 A1 | 5/2005 | Morrison et al. | |
| 2005/0125744 A1 * | 6/2005 | Hubbard | G06F 3/0482 715/824 |
| 2006/0067577 A1 * | 3/2006 | Marggraff | G06F 3/03545 382/187 |

(Continued)

OTHER PUBLICATIONS

"Introduction to Windows Presentation Foundation" http://msdn.microsoft.com/en-us/library/aa970268(printer).aspx, Aug. 5, 2009.

(Continued)

*Primary Examiner* — Rashawn N Tillery
(74) *Attorney, Agent, or Firm* — Cesari and McKenna, LLP; James A. Blanchette (57) ABSTRACT

In one embodiment, techniques are used to create a customized 3-D menu for controlling an application (e.g., a CAD application) leveraging the application's native storage format to describe the menu's appearance and function. The menu is defined using elements of a model to which commands are associated within the storage format. The elements, upon later display, operate as menu items, whose selection activates the associated command. The application's (e.g., the CAD application's) visualization capabilities may be used to rotate, zoom, or otherwise manipulated the model in in 3-D space to create a desired appearance. A view of the model is then stored within the storage format to defined an initial appearance of the 3-D menu. Upon later display, the view of the 3-D menu is loaded to provide the defined initial appearance.

19 Claims, 7 Drawing Sheets

(56) References Cited

U.S. PATENT DOCUMENTS

| | | | | |
|---|---|---|---|---|
| 2007/0124713 | A1* | 5/2007 | Ando | G06T 7/001 |
| | | | | 250/307 |
| 2010/0169836 | A1* | 7/2010 | Stallings | G06F 3/04817 |
| | | | | 715/848 |
| 2010/0315417 | A1* | 12/2010 | Cho | G06F 1/1616 |
| | | | | 345/419 |
| 2011/0093815 | A1* | 4/2011 | Gobeil | G06F 3/0482 |
| | | | | 715/825 |
| 2012/0036459 | A1* | 2/2012 | Pei | G06F 3/04815 |
| | | | | 715/765 |
| 2014/0007040 | A1* | 1/2014 | Zhong | G06F 8/00 |
| | | | | 717/104 |
| 2014/0125657 | A1* | 5/2014 | Murali | G06F 17/5004 |
| | | | | 345/419 |
| 2015/0149980 | A1* | 5/2015 | Zhong | G06F 8/20 |
| | | | | 717/105 |
| 2015/0186132 | A1 | 7/2015 | Oliveri et al. | |
| 2016/0246899 | A1* | 8/2016 | Hirschtick | G06F 30/17 |

OTHER PUBLICATIONS

"User Guide, MicroStation V8 2004 Edition", Bentley, 2004, 927 pages.

* cited by examiner

3-D SCREEN MENUS

BACKGROUND

Technical Field

The present disclosure relates generally to user interface creation, and more specifically to techniques for customized 3-D menus for controlling an application that leverages the application's native storage format to describe the menu's appearance and function.

Background Information

It is often desirable to allow users to create customized menus within applications to control application functions. For example, in computer aided design (CAD) applications it may be desirable to allow users to create customized menus that control CAD functions, to allow users to more readily access tools that may be related to a particular CAD project being worked on. Traditionally, customized menus in CAD application have been created using various user interface (UI) frameworks and toolkits. Such frameworks and toolkits are generally unaware of application content, for example, of the native storage format used to describe CAD projects. As such, rather than allow users to leverage (e.g., re-use) existing content in the CAD application, traditional UI frameworks and toolkits have required users to design interfaces from the ground up, generating representations to operate as menu items. Further many UI frameworks and interface have offered limited three-dimensional (3-D) capabilities. User's have often been unable to rotate, zoom, or otherwise manipulated menus in 3-D space to create desired appearances.

Accordingly, there is a need for improved techniques for creating customized 3-D menus.

SUMMARY

Techniques are provided for creating customized 3-D menus for controlling an application (e.g., a CAD application) that leverage the application's native storage format to describe menu appearance and function. A 3-D menu is defined using elements of a model to which commands are associated within the storage format. The elements, upon display, operate as menu items whose selection activates the associated command. The application's (e.g., the CAD application's) visualization capabilities are used to rotate, zoom, or otherwise manipulated the model in 3-D space to create a desired initial appearance for the 3-D menu. A view of the model is stored within the storage format to define the initial appearance. Upon later display, the view of the 3-D menu is loaded.

In one specific example embodiment, to create a 3-D menu, a model is created in a CAD application and elements that are to serve as menu items of the 3-D menu are added to the model. Each of the elements of the model is associated with a respective command (e.g., to control the CAD application, to control menu navigation, or to perform other functions). One or more elements of the model are assigned to a first level that is associated with the 3-D menu and, in some cases, one or more other elements of the model are assigned to other levels that are associated with 3-D sub-menus. A view of the model that displays the first level defined in 3-D space (e.g., by rotating, zooming, or otherwise manipulating the model using the CAD application's native visualization capabilities). In some cases, additional views of the model that display the other levels are defined in 3-D space. The model and the view(s) are stored in one or more files (e.g., DGNLib files) according to a storage format (e.g., a DGN storage format) utilized by the CAD application to store CAD projects. Subsequently, the 3-D menu and any 3-D sub-menus are displayed, and upon selection of a menu item, the respective command is executed. In the case where the respective command is to navigate to a sub-menu, an additional view may be displayed to show the sub-menu.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION

Figure 1:
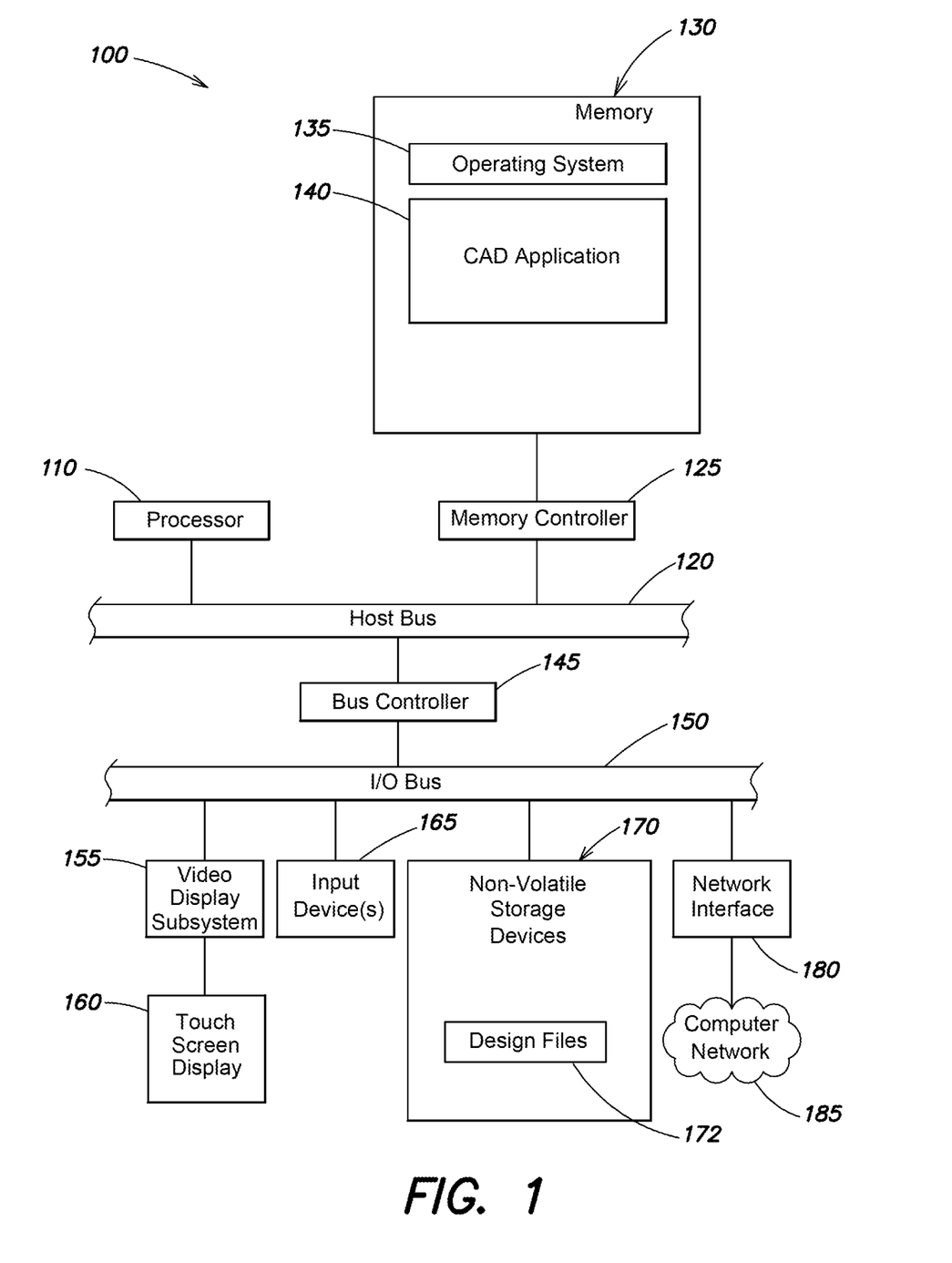
FIG. 1 is a block diagram of an example electronic device in which at least some of the presently described techniques may be employed.

FIG. 1 is a block diagram of an example electronic device 100 in which at least some of the presently described techniques may be employed. The electronic device may be designed for stationary operation (e.g., may be a desktop computer), or may be a portable electronic device (e.g., a notebook computer, a tablet computer, etc.) designed to be readily transported by a user and utilized from a variety of different locations. The electronic device 100 includes at least one processor 110 coupled to a host bus 120. A volatile memory 130, such as a random access memory (RAM), is coupled to the host bus 120 via a memory controller 125 and configured to store an in-memory copy of software and data. The in-memory copy of software may include executable instructions for an operating system 135, and a CAD application 140 among other software. Such software is loaded into the volatile memory 130 when needed from persistent copies of the software (not shown) maintained on a non-volatile storage device 170 (e.g., a hard disk, a solid-state drive, etc.) The in-memory copy of data may include an in-memory copy of one or more CAD projects being worked on in the CAD application 140.

The host bus 120 of the electronic device 100 is coupled to an input/output (I/O) bus 150 through a bus controller 145. A video display subsystem 155 that includes a display screen 160 is coupled to the I/O bus 150. The display screen 160 may show a user interface of the CAD application 140, as well as user interfaces of other software executed on the electronic device 100. One or more input devices 165 (e.g., a mouse, keyboard, touch sensor, etc.) are also coupled to the I/O bus 150. The input devices 165, among other uses, are used to interact with the CAD application 140. The above-discussed non-volatile storage device 170, and a network interface 180, are further coupled to the I/O bus 150.

The network interface 180 may be coupled to a computer network 185 (e.g., the Internet) to allow for communication between the electronic device 100 and other electronic devices, using any of a number of well-known networking protocols, thereby enabling various distributed, collaborative or remote computing configurations. It should be understood that, according to such configurations, some, or all, of the software and data shown resident in memory 130 or stored in the non-volatile storage device 170 may be remotely located on another electronic device, and accessed via the computer network 185.

The non-volatile storage device 170, in addition to storing copies of the executable software, persistently stores copies of CAD projects in design files 172 according to a storage format. In various implementations, the application 140 and the storage format may take on various forms. In some specific implementations, the CAD application 140 is Microstation® modeling, documentation, and visualization software available from Bentley Systems, Inc. of Exton, Pa. and the storage format is the DGN format used with DGN and DGNLib files developed by Bentley Systems, Inc. It should be understood, however, that such specific software, storage format and files are merely an example.

A CAD project stored according to the storage format in design files 172 typically is structured as data items that serve specific roles. Elements describe individual units. Models generally group together related elements into larger units, effectively "owning" a set of elements. A CAD project consists of at least one model, and often a number. Any particular model can have one or more models associated to it (and thus displayed together with that model) through an attachment. In that configuration, the first model is referred to as the root model and the other models are referred to as attached models. A level generally describes selected elements that should be displayed (e.g., "turned on") and symbology (e.g., color, line weight, line style, etc.) that controls their visual appearance. Views generally are representations of selected elements shown with certain symbology. Views may be defined by attachment paths from a root model in the model graph, with the symbology of elements indicated by elements of the model graph, the levels to which the elements belong, and by attachment specific copies of levels ("attached levels") that override the displayed elements and symbology of the levels.

As discussed above, in some cases it may be desirable to generate a customized 3-D menu for controlling a CAD application 140. The native storage format of the CAD application 140, namely the storage format (e.g., DGN) of the design files 172 (e.g., DGNLib files) may be leveraged, to avoid the limitations of separate UI frameworks and toolkits. In one embodiment, a 3-D menu is defined using elements of a model to which commands are associated within the storage format. The elements, upon later display, operate as menu items, whose selection activates the associated command. The model may be rotated, zoomed or otherwise manipulated in 3-D space to create a desired appearance. A view of the model is stored within the storage format to define an initial appearance of the 3-D menu. Upon later display, the view of the menu is loaded to provide the defined initial appearance. 3-D sub-menus and other features may also be provided leveraging the storage format of the design files 172.

Figure 2:
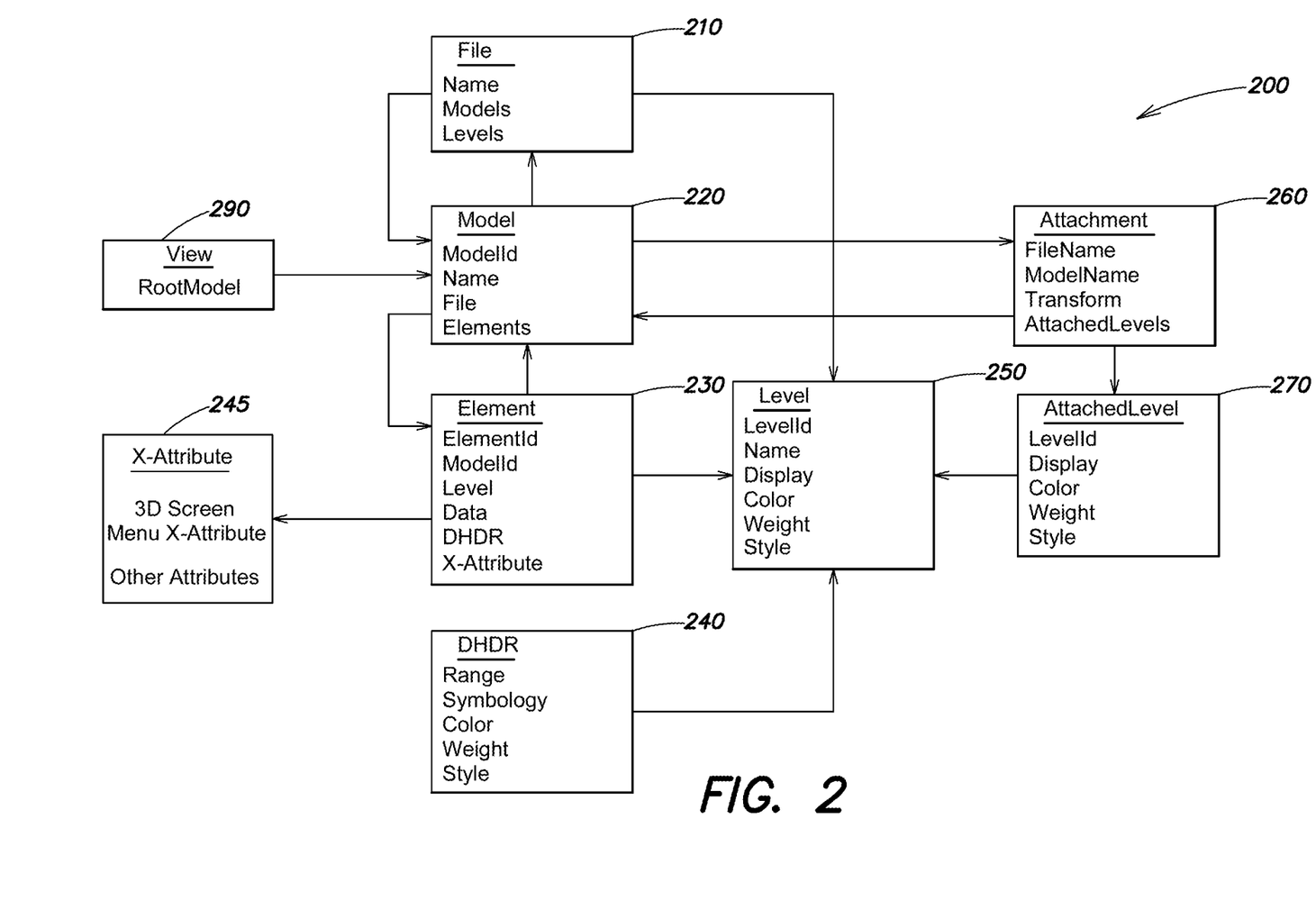
FIG. 2 is a data structure diagram illustrating details of an example storage format (e.g., a DGN storage format) of design files (e.g., DGNLib files) leveraged for use in creating 3-D menus.

FIG. 2 is a data structure diagram 200 illustrating details of an example storage format (e.g., DGN storage format) of design files 172 (e.g., a DGNLib file) leveraged for use in creating 3-D menus. In the data structure diagram 200, a file data structure 210 serves as a header of each file, and includes a name field that indicates a unique human readable name for the file, a models field that references model data structures contained in the file, and a levels field that references level data structures contained in the file. Each model data structure 220 represents an individual model and includes a model ID field that indicates a unique identifier for the model, a name field that indicates a unique human readable name for the model, a file field that references the owning file, and elements fields that reference element data structures owned by the model. Each model may be associated with a spatial coordinate systems used to define the arrangement of elements. Each element data structure 230 represents an individual element owned by a model. As discussed above, an element may serve as a menu item for a 3-D menu (or 3-D sub-menu thereof). The element data structure includes an element ID field that indicates a unique identifier for the element, a model ID field that indicates the owning model data structure, a level field that indicates a level associated with the element, a data field that includes information describing the unit being represented by the element, a DHDR field that indicates an associated DHDR data structure 240, and an XAttribute field that indicates an associated XAttribute data structure 245. Each DHDR data structure 240 indicates range and symbology information that describes how the owning element should be rendered, including a color field, a weight field and a style field, that describe how the owning element should be rendered. Each XAttribute data structure 245 includes one or more attributes, such as a 3-D screen menu XAttribute in which information describing the element's operation as a menu item is stored, and/or other XAttributes in which or other information is stored.

Each element data structure 230 may reference a level data structure 250. Each level data structure 250 represents a level to which elements may belong. Each level data structure 250 includes a level ID field that indicates a unique identifier for the level, a name field that indicates a unique human-readable name for the level, a display field that indicates whether the elements of that level should be displayed (e.g., "turned on"), and symbology fields, such as a color field, a weight field and a style field, that indicate overrides to the symbology of individual elements of the level.

A model graph is defined using attachment data structures that defines the ownership structure of models and the presence of any attached levels. Each attachment data structure 260 includes a file name field that references the file containing the attached model, a model name field that references the attached model, a transform field that indicates any spatial transform that may be applied to relate a spatial coordinate systems used by the attached model to that of the owning model, and an attached level field that references an attached level that may be used with the attachment. Each attached level data structure 270 defines overrides for an underlying level, and includes a level ID field that identifies the attached level, a display field that may override the display status of the level, and symbology fields, such as a color field, a weight field and a style field, that may override the symbology of the level. A view may be defined in the model graph by a view data structure 290 that references a particular model data structure 220 that serves as a root for attachment paths through the model graph that define the view. Among other uses, a view may be used to define an initial appearance of a 3-D menu or a 3-D sub-menu thereof.

Figure 3:
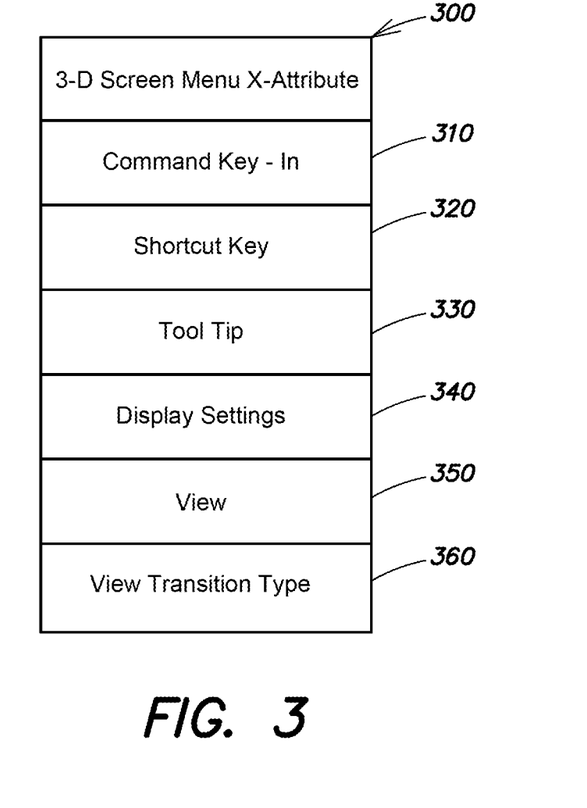
FIG. 3 is an example data structure for a 3-D screen menu XAttribute.

FIG. 3 is an example data structure 300 for a 3-D screen menu XAttribute. The 3-D screen menu XAttribute includes a command key-in field 310 that stores a user-provided command to be executed upon selection of the menu item represented by the element. The command may relate to a CAD function of the CAD application or may relate to a menu navigation function, for example trigger the display of a 3-D sub-menu and include a specific reference to that 3-D sub-menu. A shortcut key field 320 is also provided that stores any user-provide a keyboard based shortcut to activate the command. Likewise. a tool tip field 330 is provided that stores any tooltip to be displayed upon hover-over of the menu item represented by the element; a display settings field 340 is provided that indicates whether the 3-D menu of the element should be closed upon execution of the command; a view field 350 is provided that stores an indication of any saved view to transition to when the command is executed; and a view transition type field 360 is provided that stores an indication of a transition type that is to be used if there is a view indicated in the view field 360.

Figure 4:
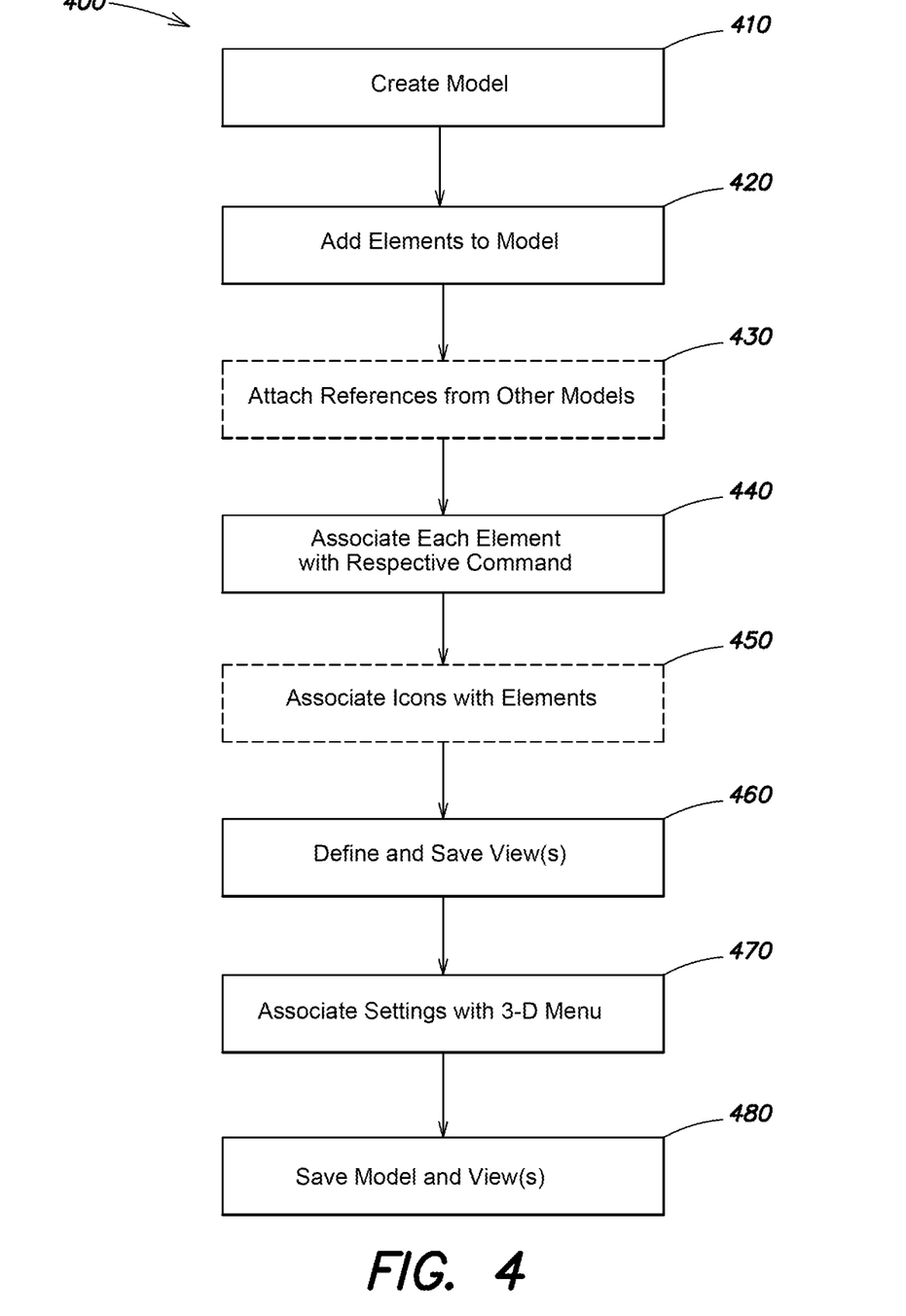
FIG. 4 is a flow diagram of an example sequence of steps for creating a 3-D menu that may include one or more 3-D sub-menus.

FIG. 4 is a flow diagram of an example sequence of steps 400 for creating a 3-D menu that may include one or more 3-D sub-menus, leveraging the native storage format of an application, in this example, the DGN format of the CAD application 140. At step 410, in response to user input, the CAD application 140 creates a model that corresponds to the 3-D menu, and makes it the active model in the CAD application. At step 420, in response to user input, the CAD application 140 adds elements to the model that are to operate as menu items, and they are positioned and orientated in 3-D model space as indicated by the user. If only a single tier 3-D menu is desired, all elements may be assigned to the same level. If multiple tiers of menus are desired, a first set of elements may be assigned to a first level, and other sets of elements may be assigned to other levels. At optional step 430, in response to user input, the CAD application 140 attaches references one or more other models within the same design file 172. At step 440, in response to user input one or more element association dialog boxes, the CAD application 140 associates each of the elements of the model with a respective command to be executed upon selection. The commands may be user-provided key-ins that control inherent CAD functions of the CAD application 140 or menu navigation functions, such as causing the display of a 3-D sub-menu. Further, as part of step 440, at least some of the elements of the model may be associated with tooltips to be displayed upon hover-over, or shortcut keys that, when entered, cause execution of the associated command. At optional step 450, in response to user input, the CAD application 140 associates icons with at least some of the elements, such that the icons are displayed therein. The icons may be obtained from resource files of the CAD applications 140 or from files provided by the operating system 135. At step 460, in response to user input, the CAD application 140 defines at least a first view of the model in 3-D space that is to represent an initial appearance of the 3-D menu when activated. The model may be rotated, zoomed, or otherwise manipulated in 3-D space using functions of the CAD application 140 to produce the desired appearance saved in the view. If there are multiple tiers to the menu (i.e. one or more 3-D sub-menus), the view may be with the first level activated (i.e. element disco play status "turned on") and any other levels deactivated (i.e. element display status "turned off"). Additional views may be defined with other levels activated to show any 3-D sub-menus. At step 470, in response to user input in a menu settings dialog, various settings, including visibility conditions, are associated with the 3-D menu and any 3-D sub-menus. At step 480, the model and view(s) are saved to a design file 172 (e.g., a DGNLib file).

After the 3-D menu and any 3-D sub-menus are created, the 3-D menu may be displayed by invoking the first view. The 3-D menu (and any 3-D sub-menus) may be displayed as permanent menus that occupy a dedicated window until closed. Alternatively, the 3-D menu (and any 3-D sub-menus) may be displayed as pop-up menus that overlay existing graphics within an existing window, and are dismissed when input not directed to the pop-up menu is received. Display of certain menu items of the 3-D menu (or the 3-D sub-menu) may be controlled by a visibility condition. In one example, the visibility condition may be a type (e.g., whether it is 2-D or 3-D) of a model of a CAD project to which the menu is attached.

A user may select menu items using an input device 165 (e.g., a mouse). In response to user-selection of a menu item, the CAD application executes the command associated with the underlying element. Alternatively, the command may be triggered by a user entering the associated shortcut key on an input device 165 (e.g., a keyboard). In the case where the command is to control a menu navigation function, such as to display a 3-D sub-menu, another view may be displayed in place of the first view.

Figure 5A:
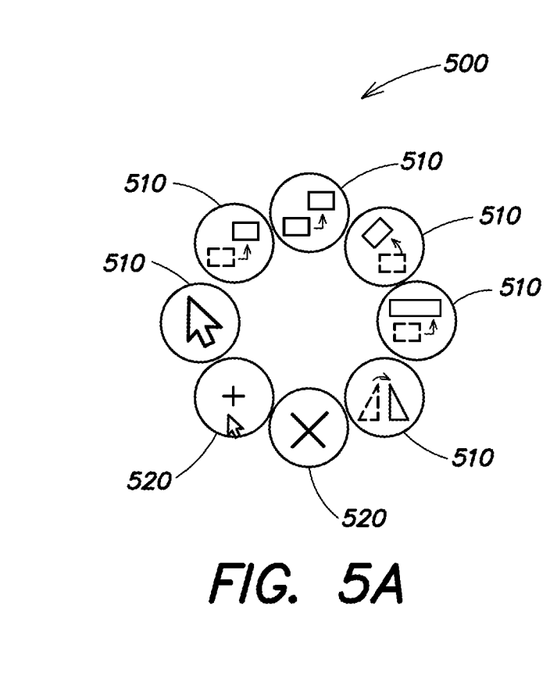
FIGS. 5*a* and 5*b* are views of an example 3-D menu and 3-D sub-menu that may be created using the steps of FIG. 4.
Figure 5B:
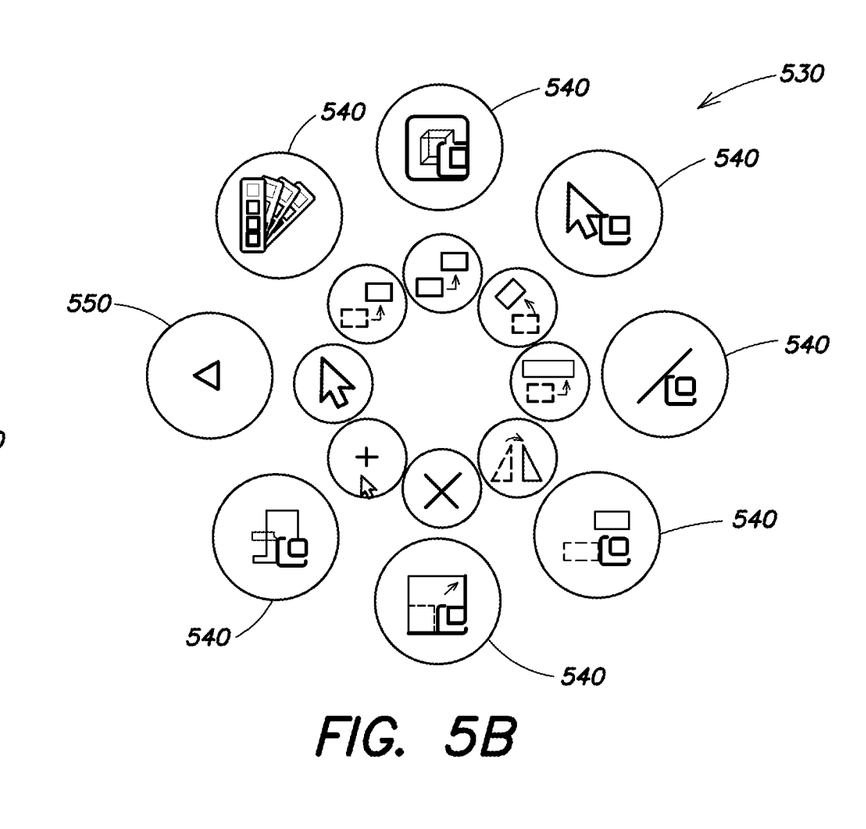

FIGS. 5*a* and 5*b* are views 500, 530 of an example 3-D menu and 3-D sub-menu that may be created using the steps 400 of FIG. 4. A first view 500 shows an initial appearance of a 3-D menu. The 3-D menu is composes of a number of menu items 510, 520 that are defined as elements that all belong to a first level, and the first level is activated (i.e. is "turned on") in the first view. In this example, at least some menu items 510, upon selection, trigger the execution of commands to control CAD functions. Further, in this example, at least some menu items 520, upon selection, control menu navigation functions, such as displaying a 3-D sub-menu or closing the 3-D menu. The commands for navigation functions may also be triggered by shortcut keys. A second view 530 shows an initial appearance of a 3-D sub-menu upon display. In this example, 3-D sub-menu is shown together with the 3-D menu, however it should be understood that the 3-D menu need not still be visible. The 3-D sub-menu is composes of a number of menu items 540, 550 that as defined as elements that belong to a second level, and the second level is displayed (i.e. "turned on") in the second view, along with the first level. Again, some menu items 540 trigger execution of commands to control CAD functions while others 550 control menu navigation functions. Likewise, again shortcut keys may be used to trigger the commands or navigation functions. While only a single 3-D sub-menu is included in this example, it should be understood that using the techniques described herein any number of 3-D sub-menus may be created, forming complex menu structures.

Figure 6A:
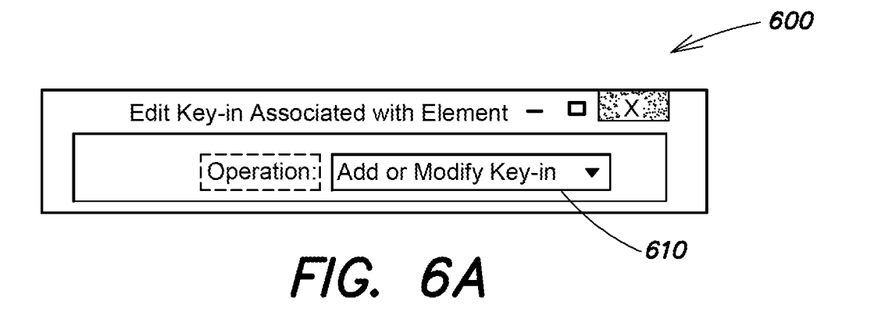
FIGS. 6*a* and 6*b* are example element association dialog boxes that may be displayed by the CAD application to receive user input regarding commands to be associated with elements.
Figure 6B:
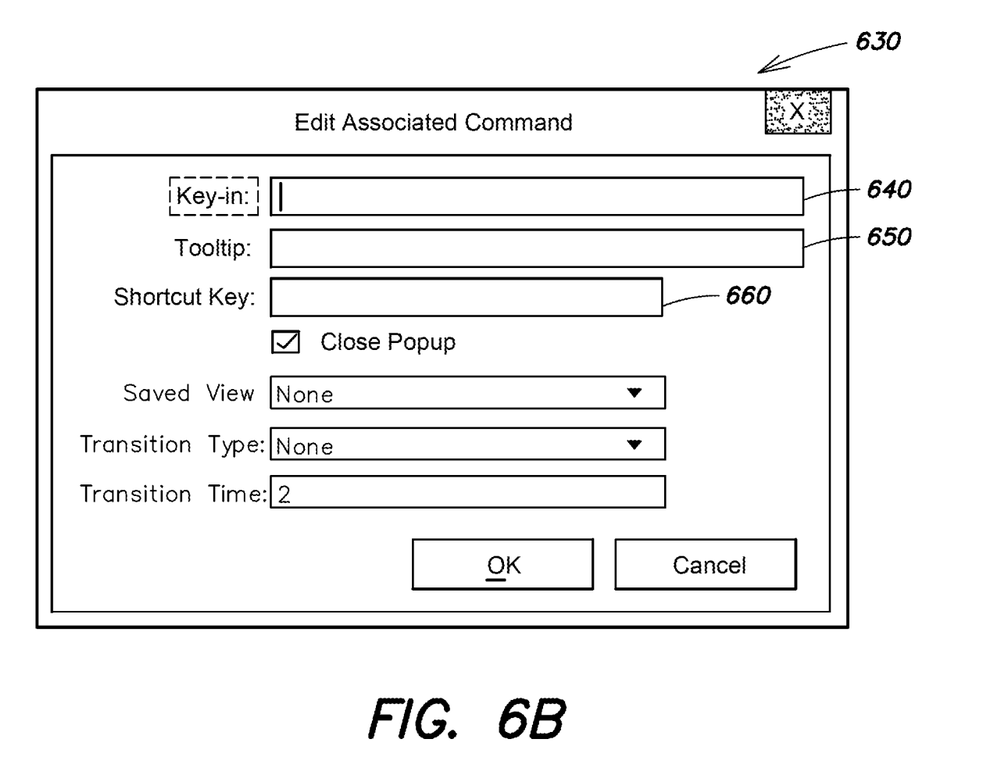

FIGS. 6*a* and 6*b* are example element association dialog boxes 600, 630 that may be displayed by the CAD application 140 to receive user input regarding commands to be associated with elements. In dialog box 600, the user may provide input in a field 610 to add an associated command or remove an associated command, triggering display of dialog box 630. In dialog box 630, a user may key-in a command in a field 640 that is associated with the element, provide a tooltip in a field 650 to be displayed upon a hover-over, provide a shortcut key in a field 660 that when entered causes execution of the associated command, among other operations.

Figure 7:
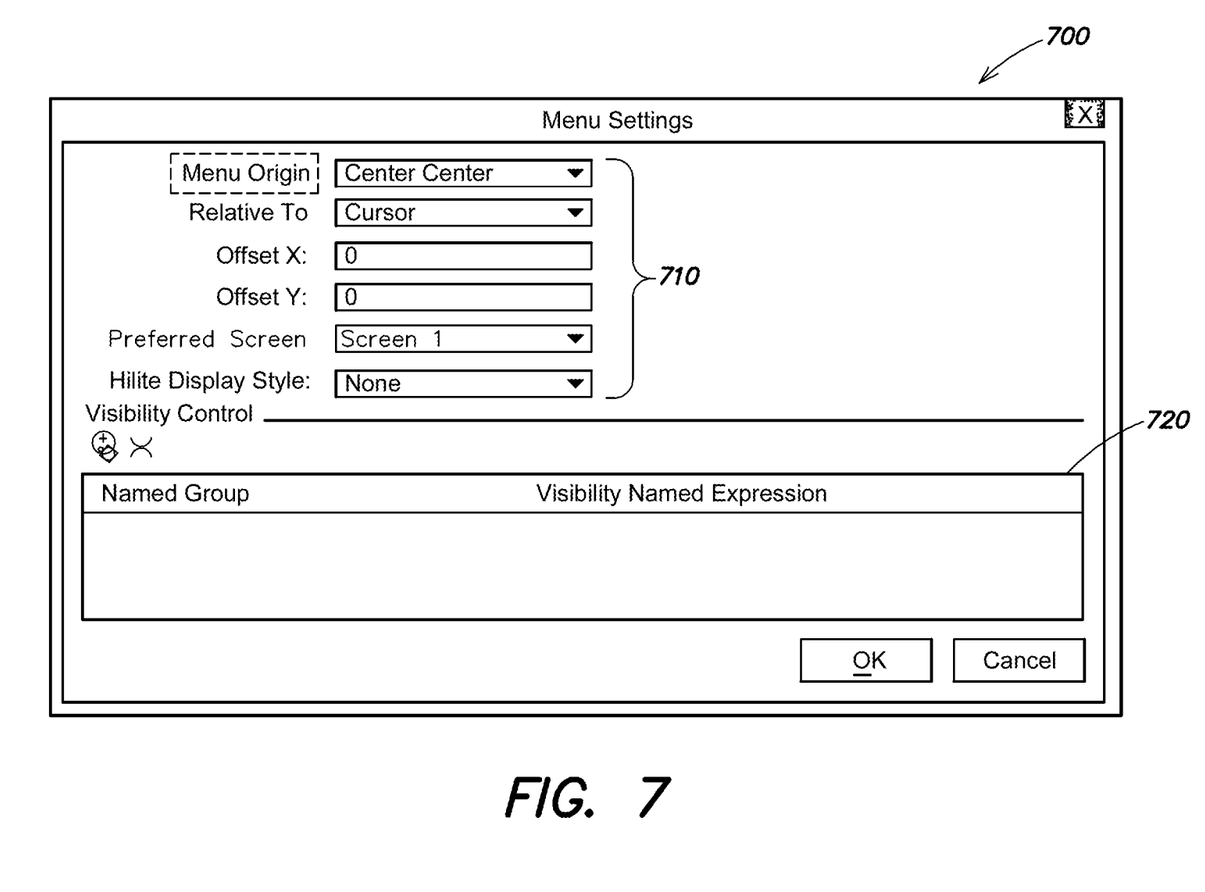
FIG. 7 is an example element menu settings dialog box that may be displayed by the CAD application.

FIG. 7 is an example element menu settings dialog box 700 that may be displayed by the CAD application 140. In fields 710, a user may indicate a desired menu screen position relative to a justification point (e.g., the cursor, screen, a view, etc.). In field 720, the user may indicate a desired visibility condition for when elements of the 3-D menu (or 3-D sub-menu thereof) should be displayed. The visibility condition may be defined by selecting a group of menu items and an expression that triggers display of that group. For example, a group may consist of menu items related to 3-D CAD functions and the expression may indicate the display of a 3-D model of a CAD project should trigger visibility of that group.

Concluding Comments

The above disclosure details techniques for creating customized 3-D menus that leverage an application's (e.g. a CAD application's) native storage format to describe menu appearance and function. It should be understood that various adaptations and modifications may be made to the above discussed techniques. For example, while the techniques are described in connection with 3-D menus, it should be understood that they are also applicable to two-dimensional (2-D) menus. Further, while specific operations are discussed above as executed by software of particular applications, it should be understood that such operations may be executed by other software, by hardware, or by various combinations thereof. In general, software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above descriptions are meant to be taken only by way of example.

What is claimed is:

1. A method for creating a customized three-dimensional (3-D) menu, the method comprising:
   creating a computer aided design (CAD) project that includes a model in a CAD application, wherein the model is a data structure that groups together a plurality of elements that describe individual units of the CAD project, the model being a member of a model graph having a root model and one or more additional models related by attachment paths;
   adding one or more elements to the plurality of elements of the model of the CAD project, by the CAD application, each of the one or more elements to serve as a menu item of the 3-D menu;
   associating, by the CAD application, each of the one or more elements of the model of the CAD project with a respective command, the respective command to be executed upon selection of the menu item;
   organizing, by the CAD application, the one or more elements of the model of the CAD project as a level, wherein the level is a data structure that describes selected elements to be displayed and symbology that controls visual appearance of the selected elements;
   defining a view of the model of the CAD project in 3-D space, wherein the view of the model is defined by an attachment path from the root model in the model graph, the view of the model to represent an initial appearance of the 3-D menu by activating the level; and
   storing, by the CAD application, the model of the CAD project including the one or more elements of the model of the CAD project that serve as menu items of the 3-D menu, and the view of the model that represents the initial appearance of the 3-D menu, in one or more files according to a native storage format of the CAD application.

2. The method of claim 1, further comprising:
   organizing, by the CAD application, one or more other elements of the plurality of elements of the model of the CAD project that are associated with respective commands as a second level, wherein the second level is another data structure that describes further selected elements to be displayed and symbology that controls visual appearance of the further selected elements;
   defining a second view of the model of the CAD project in 3-D space, wherein the second view of the model is defined by a second attachment path from the root model in the model graph, the second view of the model to represent a 3-D sub-menu to be displayed upon selection of a particular menu item of the 3-D menu by activating the second level; and
   associating the second view with a particular element of the one or more elements that serves as the particular menu item.

3. The method of claim 1, further comprising:
   associating the 3-D menu with a visibility condition, the visibility condition to display or suppress the 3-D menu in the CAD application based on a property of the CAD project.

4. The method of claim 1, further comprising:
   displaying the 3-D menu in the CAD application; and
   in response to user-selection of a particular menu item in the 3-D menu, executing the command associated with the element that serves as the particular menu item.

5. The method of claim 3, wherein the displaying displays the 3-D menu in a dedicated window in the CAD application.

6. The method of claim 3, wherein the displaying displays the 3-D menu as a pop-up menu in the CAD application.

7. The method of claim 1, wherein the native storage format is a DGN storage format and the one or more files are DGNLib files.

8. The method of claim 1, wherein the command is a user-provided key-in.

9. The method of claim 1, wherein the associating further comprises:
   associating at least one of the one or more elements of the model of the CAD project with a tooltip to be displayed upon a hover-over or a shortcut key that when entered causes execution of the associated command.

10. A non-transitory electronic device readable medium having instructions stored thereon, the instructions when executed on one or more processors of an electronic device being operable to:
    create a model of a computer aided design (CAD) project according to a native storage format of the CAD application, wherein the model is a data structure that groups together a plurality of elements that describe individual units of the CAD project, the model being a member of a model graph having a root model and one or more additional models related by attachment paths;

add one or more elements to the plurality of elements of the model of the CAD project, each of the one or more elements to serve as a menu item of a three-dimensional (3-D) menu of a CAD application;

associate each of the one or more elements of the model with a respective command, the respective command to be executed upon selection of the menu item to control a function of the CAD application;

organize the one or more elements of the model of the CAD project as a level, wherein the level is a data structure that describes selected elements to be displayed and symbology that controls visual appearance of the selected elements;

define a view of the model of the CAD project, wherein the view of the model is defined by an attachment path from the root model in the model graph, the view of the model to represent an initial appearance of the 3-D menu by activating the level;

store the model of the CAD project including the elements that serve as menu items of the 3-D menu, and the view of the model that represents the initial appearance of the 3-D menu, according to the native storage format of the CAD application;

display the 3-D menu; and in response to user-selection of a particular menu item in the 3-D menu, execute the command associated with the element that serves as the particular menu item.

11. The non-transitory electronic device readable medium of claim 10, wherein the instructions when executed are further operable to:

organize one or more other elements of the plurality of elements of the model of the CAD project that are associated with respective commands as a second level, wherein the second level is another data structure that describes further selected elements to be displayed and symbology that controls visual appearance of the further selected elements;

define a second view of the model of the CAD project, wherein the second view of the model is defined by a second attachment path from the root model in the model graph, the second view of the model to represent a sub-menu to be displayed upon selection of a particular menu item of the 3-D menu by activating the second level; and associate the second view with a particular element of the one or more elements that serves as the particular menu item.

12. The non-transitory electronic device readable medium of claim 10, wherein the instructions when executed are further operable to:

associate the 3-D menu with a visibility condition, the visibility condition to display or suppress the 3-D menu based on a property of the CAD project.

13. The non-transitory electronic device readable medium of claim 10, wherein the 3-D menu is displayed in a dedicated window.

14. The non-transitory electronic device readable medium of claim 10, wherein the 3-D menu is displayed as a pop-up menu.

15. The non-transitory electronic device readable medium of claim 10, wherein the native storage format is a DGN storage format and the one or more files are DGNLib files.

16. The non-transitory electronic device readable medium of claim 10, wherein the command is a user-provided key-in.

17. The non-transitory electronic device readable medium of claim 10, wherein the instructions when executed are further operable to:

associate at least one of the one or more elements of the model of the CAD project with a tooltip to be displayed upon a hover-over or a shortcut key that when entered causes execution of the associated command.

18. An electronic device configured to create a customized three-dimensional (3-D) menu, the electronic device comprising an input device;

a display screen;

a processor configured to execute instructions of applications; and a memory configured to store a computer aided design (CAD) application executed on the processor, the CAD application when operated by a user configured to:

create a model of a CAD project, wherein the model is a data structure that groups together a plurality of elements that describe individual units of the CAD project, the model being a member of a model graph having a root model and one or more additional models related by attachment paths, add one or more elements to the plurality of elements of the model of the CAD project, each of the one or more elements to serve as a menu item of the 3-D menu when displayed on the display screen;

associate each of the one or more elements of the model of the CAD project with a respective command, the respective command to be executed upon selection of the menu item using the input device, organize the one or more elements of the model of the CAD project as a level, wherein the level is a data structure that describes selected elements to be displayed and symbology that controls visual appearance of the selected elements;

define a view of the model in 3-D space, wherein the view of the model is defined by an attachment path from the root model in the model graph, the view of the model to represent an initial appearance of the 3-D menu by activating the level on the display screen, and store the model of the CAD project including the elements that serve as menu items of the 3-D menu, and the view of the model that represents the initial appearance of the 3-D menu, in the memory according to a native storage format of the CAD application.

19. A method for creating a customized three-dimensional (3-D) menu, the method comprising:

adding a plurality of elements to a model of a CAD project, by a computer aided design (CAD) application, each of one or more of the elements of the model of the CAD project serving as a menu item of the 3-D menu;

associating, by the CAD application, each of the one or more elements of the model of the CAD project with a respective command to be executed upon selection of the menu item, at least one of the respective commands to control a function of the CAD application;

organizing, by the CAD application, the one or more elements of the model of the CAD project as a level, wherein the level is a data structure that describes selected elements to be displayed and symbology that controls visual appearance of the selected elements;

defining a view of the model of the CAD project in 3-D space, the view of the model to represent an initial appearance of the 3-D menu by activating the level;

organizing, by the CAD application, one or more other elements of the model of the CAD project that are associated with respective commands as a second level wherein the second level is another data structure that describes further selected elements to be displayed and symbology that controls visual appearance of the further selected elements;

defining a second view of the model of the CAD project in 3-D space, the second view of the model to represent a 3-D sub-menu to be displayed upon selection of a particular menu item of the 3-D menu by activating the second level; and storing, by the CAD application, the model of the CAD project, by maintaining the one or more elements that serve as menu items of the 3-D menu in element data structures of a DGN storage format, the first level and second level in level data structures of the DGN storage format, and the view of the model that represents the initial appearance of the 3-D menu and the view of the model that represents the 3-D sub-menu in view data structures of the DGN storage format that reference the level data structures.

* * * * *

UNITED STATES PATENT AND TRADEMARK OFFICE
CERTIFICATE OF CORRECTION

PATENT NO. : 10,754,495 B1
APPLICATION NO. : 15/091266
DATED : August 25, 2020
INVENTOR(S) : Barry J. Bentley et al.

Page 1 of 1

It is certified that error appears in the above-identified patent and that said Letters Patent is hereby corrected as shown below:

In the Specification

Column 4, Line 23 reads:
"ciated with a spatial coordinate systems used to define the"
Should read:
--ciated with a spatial coordinate system used to define the--

Column 6, Line 5 reads:
"activated (i.e. element disco play status "turned on") and any"
Should read:
--activated (i.e. element display status "turned on") and any--

Signed and Sealed this
Twentieth Day of July, 2021

Drew Hirshfeld
*Performing the Functions and Duties of the
Under Secretary of Commerce for Intellectual Property and
Director of the United States Patent and Trademark Office*